(12) United States Patent
Hsieh et al.

(10) Patent No.: US 10,910,249 B2
(45) Date of Patent: Feb. 2, 2021

(54) SYSTEMS AND METHODS FOR AUTOMATED WAFER HANDLING (71) Applicant: Taiwan Semiconductor Manufacturing Co., Ltd., Hsinchu (TW)

(72) Inventors: Feng-Lung Hsieh, Hsinchu (TW); Kuo-Hsiang Huang, Hsinchu (TW); Hung-Jen Lu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 114 days.

(21) Appl. No.: 16/186,936

(22) Filed: Nov. 12, 2018

(65) Prior Publication Data
US 2019/0148198 A1 May 16, 2019

Related U.S. Application Data

(60) Provisional application No. 62/585,458, filed on Nov. 13, 2017.

(51) Int. Cl.
| | | |
|---|---|---|
| *H01L 21/677* | (2006.01) | |
| *B65G 47/90* | (2006.01) | |
| *B25J 9/16* | (2006.01) | |
| *H01L 21/67* | (2006.01) | |
| *B65G 1/137* | (2006.01) | |

(52) U.S. Cl.
CPC ...... *H01L 21/67724* (2013.01); *B25J 9/1694* (2013.01); *B65G 47/90* (2013.01); *H01L 21/6773* (2013.01); *H01L 21/67276* (2013.01); *H01L 21/67294* (2013.01); *H01L 21/67727* (2013.01); *H01L 21/67733* (2013.01);
(Continued)

(58) Field of Classification Search
CPC .......... G05D 2201/0216; Y10S 414/14; H01L 21/67724; H01L 21/67733; H01L 21/6773; H01L 21/67294
See application file for complete search history.

(56) References Cited

U.S. PATENT DOCUMENTS

| | | | |
|---|---|---|---|
| 5,536,128 A * | 7/1996 | Shimoyashiro ... | H01L 21/67161 118/719 |
| 6,050,768 A * | 4/2000 | Iwasaki ............ | H01L 21/67276 414/222.01 |

(Continued)

FOREIGN PATENT DOCUMENTS

JP  10-308429 A  11/1998

OTHER PUBLICATIONS

Official Action dated Jun. 12, 2019, in corresponding Taiwan Patent Application No. 10820538500.
(Continued)

*Primary Examiner* — Timothy R Waggoner
(74) *Attorney, Agent, or Firm* — Duane Morris LLP (57) ABSTRACT

In an embodiment a system includes: a wafer store comprising a wafer configured for processing by a semiconductor processing tool; a cart configured to transport the wafer from the wafer store along a predetermined path; a robotic arm, the robotic arm configured to: read wafer data from the wafer store, transport the wafer from the wafer store to the cart, send the wafer data to the cart, wherein the cart is configured to transport the wafer to a location in response to the wafer data.

20 Claims, 6 Drawing Sheets

(52) U.S. Cl.
CPC ........ *H01L 21/67781* (2013.01); *B65G 1/137* (2013.01); *B65G 2201/0297* (2013.01)

(56) References Cited

U.S. PATENT DOCUMENTS

| | | | | |
|---|---|---|---|---|
| 2002/0154974 A1* | 10/2002 | Fukuda | ............. | H01L 21/67294 414/416.01 |
| 2004/0128023 A1* | 7/2004 | Chae | ................ | H01L 21/67276 700/214 |
| 2010/0202861 A1* | 8/2010 | Sawado | ............ | H01L 21/67724 414/222.02 |
| 2013/0184849 A1* | 7/2013 | Chan | ................ | G05B 19/41815 700/113 |
| 2013/0325159 A1 | 12/2013 | Kilibarda et al. | | |
| 2017/0166399 A1* | 6/2017 | Stubbs | ................... | B25J 9/0096 |

OTHER PUBLICATIONS

Nedeljkovic, M. et al. "Free-carrier Electrorefraction and Electroabsorption Modulation Predictions for Silicon Over the 1-14 um Infrared Wavelength Range", Photonics Journal, IEEE, Dec. 2011, 3(6):1171-1180.

* cited by examiner

SYSTEMS AND METHODS FOR AUTOMATED WAFER HANDLING

CROSS-REFERENCE TO RELATED APPLICATION

The present application claims priority to U.S. Provisional Patent Application No. 62/585,458, filed on Nov. 13, 2017, which is incorporated by reference herein in its entirety.

BACKGROUND

Automated material handling systems (AMHS) have been widely used in semiconductor fabrication facilities (also termed as FABs) to automatically handle and transport groups or lots of wafers between various processing machines or tools used in chip manufacturing. A typical FAB may include a plurality of process bays including processing tools (e.g., a process tool) and wafer staging equipment.

Each bay may include a wafer stocker, which includes multiple bins for temporarily holding and staging a plurality of wafer carriers during the fabrication process. The wafer carriers may include standard mechanical interface (SMIF) pods which may hold a plurality of wafers, or front opening unified pods (FOUPs) which may hold larger wafers. Stockers generally include a single mast robotic lift or crane having a weight bearing capacity sufficient for lifting, inserting, and retrieving a single wafer carrier at one time from the bins. The stocker holds multiple SMIF pods or FOUPs in preparation for transporting a SMIF or FOUP to the loadport of a processing tool.

A semiconductor FAB may include numerous types of automated and manual vehicles for moving and transporting wafer carriers throughout the FAB during the manufacturing process. These may include for example manually moved carts, rail guided vehicles (RGVs), overhead shuttles (OHSs), and overhead hoist transports (OHTs). In an AMHS, an OHT system automatically moves OHT vehicles that carry and transport wafer carriers, such as SMIF pods or FOUPs holding multiple wafers, from a processing or metrology tool (e.g., process tool) or a stocker to the loadport of another tool or other apparatus in the FAB. The OHT system may be used to transport vehicles within each bay (intra-bay) or between bays (inter-bay). The OHT system also moves empty vehicles (i.e. without a wafer carrier) to the tool loadport or other apparatus for receiving and removing empty or full SMIF pods or FOUPs that may contain wafers for further transport and/or processing in other tools.

Handling and transport of wafers in an AMHS is typically built into a FAB and may not be easily adapted when processing machines or tools used in chip manufacturing are moved or changed in a FAB. However, typical manual handling and transportation of wafers also requires large overhead and is prone to human failure. Accordingly, an improved system and method for handling wafer transport in a semiconductor FAB is desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an automated wafer handling system utilizing networked and automated free moving vehicles that are not restricted to movement along a railed system of an automated material handling system (AMHS). As introduced above, semiconductor fabrication facilities (e.g., FABs) may typically utilize either a railed automated material handling system or manual movement of wafers in wafer carriers around a FAB between different wafer handling areas (e.g., areas of wafer processing or storage). However, the typical railed AMHS systems have a limited range of movement and configuration due to typically being physically built into a FAB facility. Also, typical manual movement may be resource intensive and prone to human error, due to requiring manual human movement and control.

Accordingly, an automated wafer handling system utilizing networked and automated free moving vehicles may provide for automated movement of wafers around a FAB, such as between processing tools, while being configurable to changes in FAB layout between different processing tool locations and/or changing space constraints within a FAB.

An automated wafer handling system may typically include different classes of automated guided vehicles that may autonomously communicate and coordinate amongst themselves for movement of wafers around a FAB. For example, an automated wafer handling system may include a mobile robotic arm that may be configured to physically handle and move wafers from one location to another by securing, lifting, and moving the wafer (e.g., a wafer as part of a wafer carrier) from one platform (e.g., a wafer store) to another platform (e.g., an autonomous cart). The autonomous cart may be configured to support and transport a wafer (e.g., a wafer as part of a wafer carrier) from one location to another location in an autonomous fashion. Accordingly, mobile robotic arms may be disposed at various locations to move wafers between platforms. Also, autonomous carts may be configured to move wafers between different locations for further transport by the mobile robotic arms. Furthermore, wafer data may be associated with each wafer undergoing transport as part of the automated wafer handling system and be transferred around the FAB via the mobile robotic arms and autonomous carts. Furthermore, as the mobile robotic arms and autonomous carts are each mobile, their configuration relative to the various fixtures of the FAB (e.g., processing tools and/or wafer stockers) may be fluid and reconfigurable as the various fixtures of the FAB are moved and/or serviced.

For simplicity of discussion, a wafer store, mobile robotic arm, and autonomous cart may be referred to more generally as a wafer handling node. Also, each wafer handling node may be either active with an active module that actively facilitates communication and control among the wafer handling nodes, or passive without the active module (e.g., a rack). By being active, the wafer handling node may actively communicate with other wafer handling nodes, such as via conventional wireless communication protocols, to communicate information such as commands and/or wafer data to and from other active wafer handling nodes. By being passive, a wafer handling node may not actively facilitate communication and control among the wafer handling nodes. For example, a passive wafer handling node may include a rack on which wafers and/or wafer carriers may be stored. The rack may receive wafer data that is stored on the wafer carriers (e.g., as an RFID tag or other computer readable medium) which may be put into the rack by a mobile robotic arm. Also, the mobile robotic arm, as an active wafer handling node, may receive wafer data from the rack based on reading the wafer data stored on the wafer carrier. The active module and differences between active and passive wafer handling nodes will be discussed in further detail below.

In certain embodiments, a wafer store area may be demarcated around a wafer store to define an area in which a manual operation (e.g., via a human) may, optionally, move wafers and/or wafer carriers and when automatic operation (e.g., via a mobile robotic arm and/or an autonomous cart) may move wafers and/or wafer carriers. For example, the wafer store area may be an area within about 8 meters of a wafer store such that manual operation may performed within the wafer area while automatic operation is performed outside of the wafer area to move wafers and/or wafer carriers. In particular embodiments, an area of about 8 meters may generally encompass an area in which a manual operation may be easily performed from a human moving a wafer and/or wafer carrier without expending significant effort.

In particular embodiments, wafer stores may be located at regular intervals across an automated wafer handling system. For example, a network of wafer stores may form crisscrossing paths across an automated wafer handling system such that wafers and/or wafer carriers that are moved across the automated wafer handling system may be moved from wafer store to wafer store in order to be moved across the automated wafer handling system. In certain embodiments, the wafer stores may be outfitted with local sensors to periodically perform checks on the wafers and/or wafer carriers as they are moved to and from the wafer stores. These local sensors may include, for example, vibrational sensors.

In a variety of embodiments, vibrational sensors may be utilized at any of a wafer store, mobile robotic arm, and autonomous cart. These vibrational sensors may be utilized to determine whether there are extreme vibrations experienced, such as due to an earthquake. For example, a vibrational threshold (e.g., a vibrational threshold value) may be established that determines when vibrations experienced at the vibrational sensor is over a particular threshold. Then, remediation may be performed when the vibrations exceed the vibrational threshold. This vibrational threshold may be, for example, measured in any of a velocity, acceleration, and/or displacement. In certain embodiments, the vibrational sensor may be an accelerometer or a vibration meter configured to characterize a velocity, acceleration, and/or displacement experienced at the vibrational sensor.

In particular embodiments, when a vibrational sensor detects vibrations above the vibrational threshold, the associated wafer store(s), mobile robotic arm(s), and/or autonomous cart(s) may perform remediation by pausing operations (e.g., stopping operations at the associated wafer store(s), mobile robotic arm(s), and/or autonomous cart(s)). These associated wafer store(s), mobile robotic arm(s), and/or autonomous cart(s) may be the wafer store(s), mobile robotic arm(s), and/or autonomous cart(s) that are physically connected with the vibrational sensor that detects vibrations above the vibrational threshold. Alternatively, these associated wafer store(s), mobile robotic arm(s), and/or autonomous cart(s) may be within a relative proximity (e.g., relative to other objects in the automated wafer handling system) to the vibrational sensor that detects vibrations above the vibrational threshold. These associated wafer store(s), mobile robotic arm(s), and/or autonomous cart(s) may pause associated operations pending inspection by an operator of the automated wafer handling system. These associated operations may then be resumed after inspection (e.g., via the operator controlling or instructing the automated wafer handling system to resume operations). In particular embodiments, remediation may be performed by moving the wafers and/or wafer carriers under transport to an error location (e.g., to an error wafer store that is set aside to receive wafers and/or wafer carriers for further inspection). The wafers at the error location may be further inspected for defects. In certain embodiments, sensor data from a vibrational sensor that is above the vibrational threshold may be indicative of a transit error.

In various embodiments, a queue time threshold (e.g., as another type of threshold value) may be utilized to detect whether there is a transit error when a mobile robotic arm and/or autonomous cart takes too long to perform an operation. For example, a mobile robotic arm and/or autonomous cart taking too long to perform an operation may indicate that there is an error with the wafers and/or wafer carriers under transit. Alternatively, a mobile robotic arm and/or autonomous cart taking too long to perform an operation may indicate that there is an error with the mobile robotic arm and/or autonomous cart itself. Therefore, remediation may be performed to inspect and/or correct for this error by moving the mobile robotic arm and/or autonomous cart, and constituent wafers and/or wafer carriers, to an error location for inspection. In certain embodiments, this error location may be proximate to, or include, an error wafer store set aside to receive wafers and/or wafer carriers. The wafers and/or wafer carriers at the error location may be further inspected for defects, such as if the wafer carrier is too heavy, too light, or has some other error. Also, the mobile robotic arm and/or autonomous cart at the error location may also be inspected for defects (e.g., if a part such as a wheel or other actuator of the mobile robotic arm and/or autonomous cart is broken).

Figure 1:
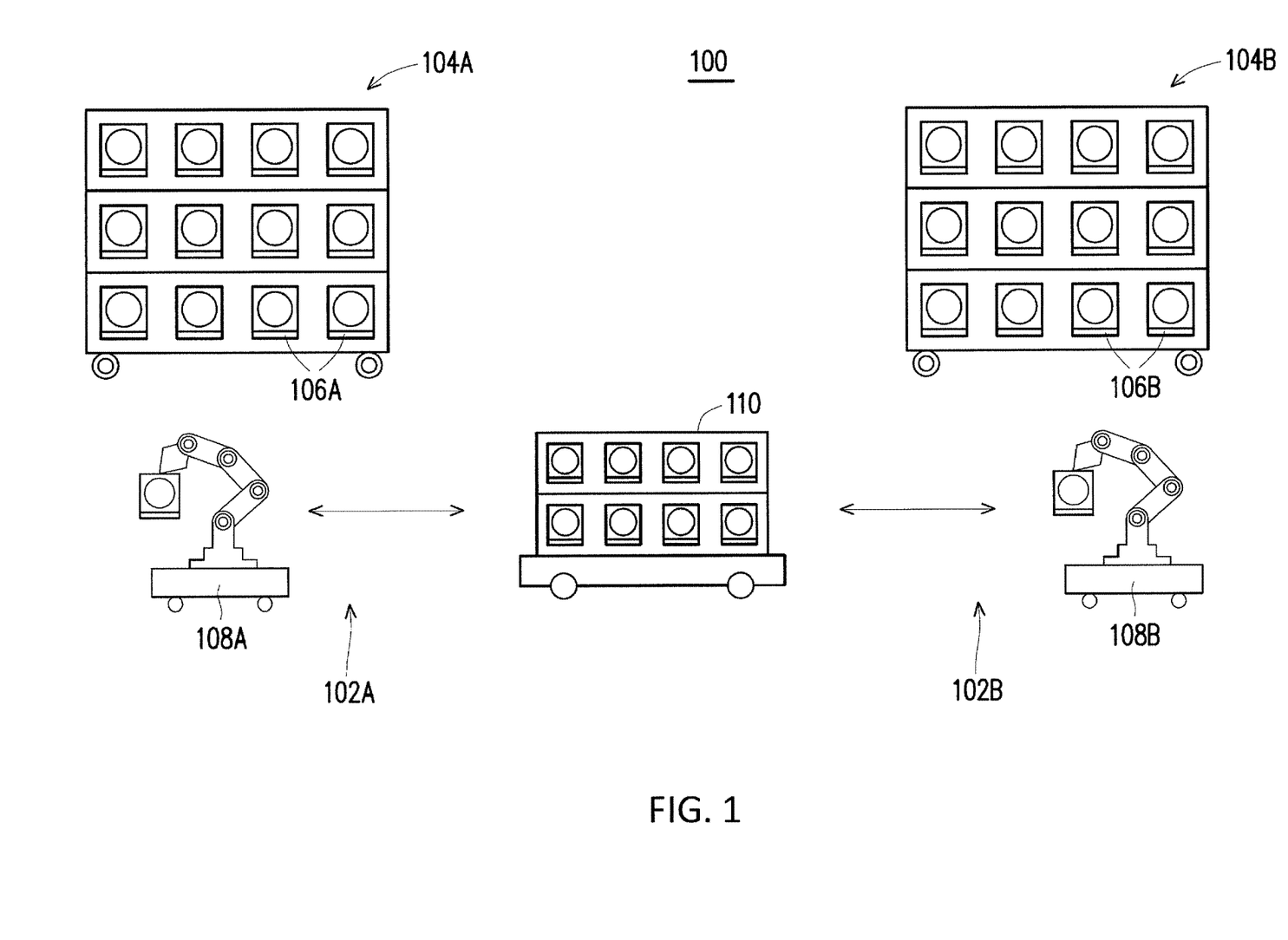
FIG. 1 is a conceptual illustration of an automated wafer handling system, in accordance with some embodiments.

FIG. 1 is a conceptual illustration of an automated wafer handling system 100, in accordance with some embodiments. The automated wafer handling system 100 may include two wafer handling areas 102A and 102B. Each wafer handling area may include a wafer store 104A or 104B, respectively, that is a rack for wafer carriers 106A, 106B respectively. Each wafer carrier may include one, or several, wafers. The automated wafer handling system 100 may include a mobile robotic arm 108A, 108B next to (e.g., adjacent to) each wafer store 104A, 104B. Also, an autonomous cart 110 may be configured to transport wafers between the first wafer handling area 102A and the second wafer handling area 102B.

Although the wafer store 104A, 104B is illustrated as a rack, any type of stationary storage or holding of a wafer may be utilized as a wafer store for different applications in accordance with various embodiments. For example, the wafer store may be a platform for passive storage of a wafer (e.g., a passive wafer handling node), such as a rack, shelf, or a table top on which a wafer carrier may be placed. Alternatively, the wafer store may be a platform for active storage of a wafer (e.g., an active wafer handling node), such as a semiconductor processing tool or a stocker (discussed further above). More specifically when the wafer store is a semiconductor processing tool, the wafer store may specifically be part of the semiconductor processing tool that is the load port where the semiconductor processing tool is configured to receive or eject the wafer carrier and the constituent wafers processed by the processing tool.

In a variety of embodiments, the wafer store may include wafer data concerning the wafers at the wafer store for which the automated wafer handling system 100 may utilize to handle (e.g., transport) the wafers. For example, the wafer store may include bar codes, radio frequency identification tags, a wired or wired communication interface, and/or any other interface from which a wafer store may communicate wafer data concerning the wafers stored at the wafer store. This wafer data may be stored centrally at a wafer store (e.g., such that the wafer store itself may be read and/or communicated with) and/or may be stored at each specific wafer carrier at the wafer store (e.g., imprinted and/or with a computer readable memory located at a specific wafer carrier). This wafer data may include, for example, identification information for the wafer carrier and/or the wafers within a particular wafer carrier, further instructions for processing of wafers within a specific wafer carrier, notes on past processing performed upon wafers within a wafer carrier, a wafer carrier transportation history (e.g., where the wafer carrier has been transported), and the like. This wafer data may be utilized by the automated wafer handling system 100 for routing the wafer carrier, and constituent wafers, for further processing. Further discussion of wafer stores will be provided below.

A mobile robotic arm 108A, 108B may be any automated guided vehicle (AGV) configured with the ability to manipulate and/or handle individual wafers and/or wafer carriers. For example, the mobile robotic aim may include a robotic arm with a gripper or other manner of manipulating or handing a wafer and/or wafer carrier from one platform to another. The term platform may refer to any place on which a wafer may be stored and/or transported, such as a wafer carrier and/or an autonomous cart, as will be discussed further below. The mobile robotic arm may manipulate and/or handle a wafer and/or wafer carrier in a conventional manner utilizing conventional robotic arm structures and techniques, and thus will not be discussed in detail herein for brevity. For example, the mobile robotic arm may pick up, move, and put back down a wafer and/or wafer carrier from one platform to another. Additionally, a mobile robotic arm 108A, 108B may be configured for autonomous movement independent of a rail or other physical guide. For example, the mobile robotic arm 108A, 108B may include a set of wheels which may move the mobile robotic arm with degrees of freedom in a rolling motion.

An autonomous cart may be an automated guided vehicle (AGV) configured to autonomously move between locations within a FAB. In certain embodiments, the autonomous cart may be configured with a pathing module that may configure the autonomous cart to determine various paths (e.g., determine various predetermined paths, or paths determined prior to setting out between locations) between different wafer handling areas (e.g., wafer handling areas 102A, 102B) autonomously and without external, manual guidance (e.g., without being driven and/or guided manually by an operator in real time). Pathing, and this pathing module, may be conventional and commercially available. For example, pathing modules may be configured to receive and execute movement along known paths between different wafer handling areas. As another example, pathing modules may autonomously explore a FAB to determine different paths between different wafer handling areas to avoid stationary obstacles. Further examples of pathing modules may include modules which may execute pathing or path finding applications, such as an application of Dijkstra's algorithm or an angle path planning algorithm. Accordingly, the pathing module will not be discussed in detail herein for brevity.

The autonomous cart 110 may be configured, or constructed, to hold a wafer and/or a wafer carrier. In certain embodiments, the autonomous cart 110 may include a structure for carrying multiple wafers and/or wafer carriers (e.g., a rack or other structure on which wafers and/or wafer carriers may be securely held during transportation by the autonomous cart 110). The structure for carrying multiple wafers and/or wafer carriers may include discreetly identifiable locations, such that wafers located on the autonomous cart may be accorded a location on the autonomous cart 110 and identified accordingly.

The autonomous cart 110 and the mobile robotic arms 108A, 108B may be configured to communicate and coordinate the transportation of wafers between wafer stores at different wafer handling areas. In certain embodiments, the autonomous cart 110 and the mobile robotic arms 108A, 108B may be configured to wirelessly communicate wafer data between the autonomous cart 110 and mobile robotic arms 108A, 108B to coordinate transportation of wafers between wafer handling areas. For example, the autonomous cart 110 may communicate availability to the mobile robotic aim. The mobile robotic arm 108A may then communicate wafer data concerning the wafers that the mobile robotic arm 108A transfers to the autonomous cart. Then, in response to completing receipt of the wafer data (which may function as a command from the mobile robotic arm), the autonomous cart 110 may transport the wafers to an appropriate wafer handling area based on the wafer data. For example, the wafer data may include an indicator, such as a packet footer or an execution command, which may indicate that the wafer data transmission is complete and that the autonomous cart 110 may proceed to transport the transferred wafer and/or wafer carrier to the appropriate handling area (e.g., wafer handling area 102B).

As another example, the mobile robotic arm 108A may communicate wafer data concerning the wafers available to the mobile robotic arm 108A (and that the mobile robotic arm may transport to the autonomous cart 110). Then, the autonomous cart may accept or reject acceptance of particular wafers and/or wafer carriers from the mobile robotic arm. Accordingly, the wafers that the autonomous cart accepted may be loaded onto the autonomous cart and transported to particular wafer handling locations by the autonomous cart (e.g., for offloading by other mobile robotic arms to other wafer stores).

In various embodiments, when loaded on an autonomous cart, a particular autonomous cart location identifier may be utilized and associated with each loaded wafer and/or wafer carrier. Accordingly, each individual loaded wafer and/or wafer carrier may be identified by its respective location (e.g., autonomous cart location identifier) on the autonomous cart for unloading.

Advantageously in certain embodiments, as each of the mobile robotic arms and/or autonomous carts are mobile, they may be reconfigured and moved about a FAB as desired in an automated fashion without needing to replace rails and/or other transportation fixtures utilized by a more immutable AMHS, such as an AMHS that moves wafer carriers overhead via vehicles suspended from an overhead rail. Furthermore, by communicating amongst the various mobile robotic arms and/or autonomous carts, the automated wafer handling system 100 may handle wafer transport and handling without need for manual intervention, as with traditional systems which relies upon human labor for transportation of wafers and/or wafer carriers around a FAB. In certain embodiments, the automated wafer handling system may be centrally controlled with each individual wafer store, mobile robotic arms and/or autonomous carts configured to operate automatically and without individual instructions. For example, various predetermined routines may be chosen and executed based on simply noting the locations and types of wafer stores that the automated wafer handling system 100 are to transport wafers and/or wafer carriers between.

Figure 2A:
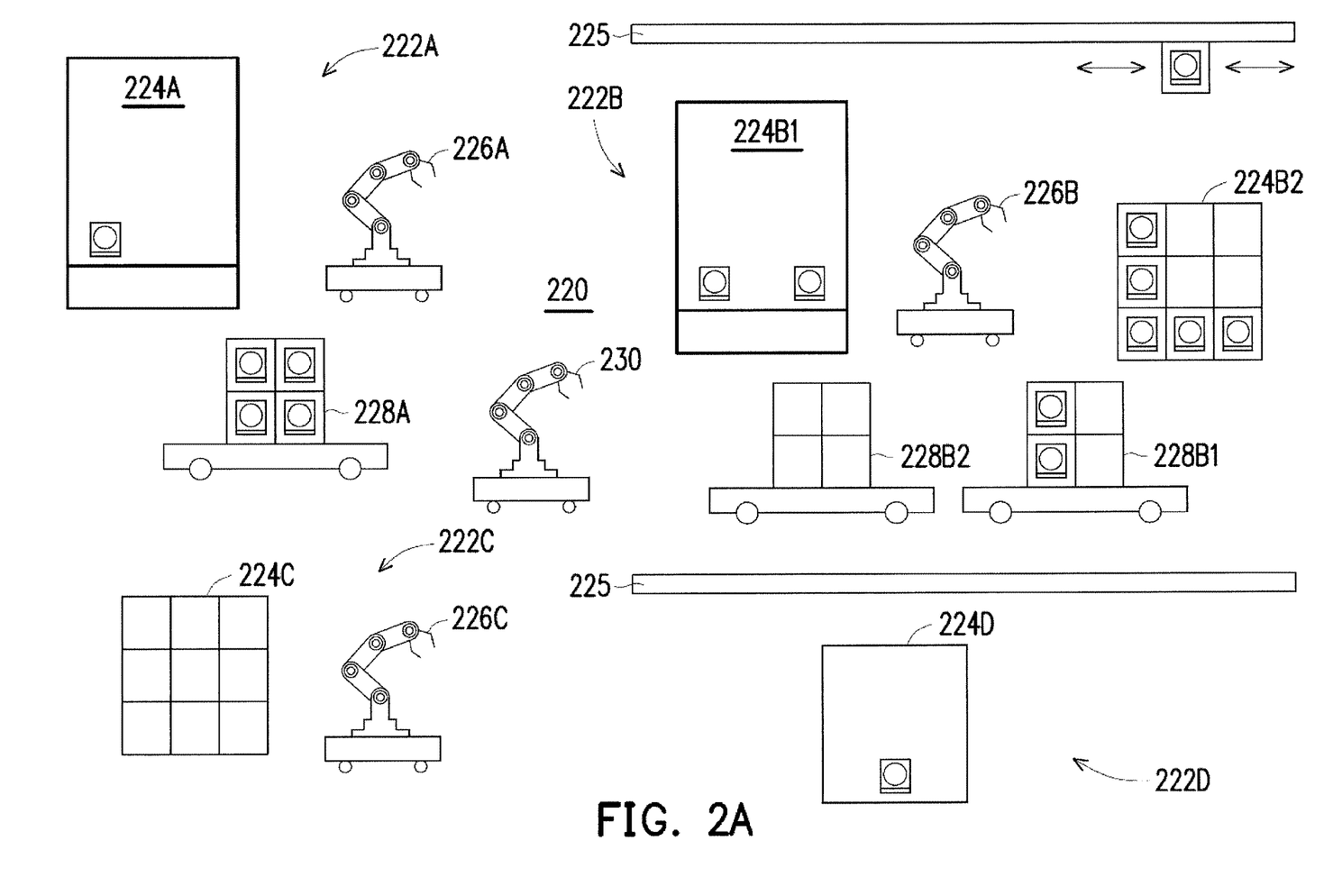
FIG. 2A is a conceptual illustration of an automated wafer handling system with multiple wafer handling locations, in accordance with some embodiments.

FIG. 2A is a conceptual illustration of an automated wafer handling system 220 with multiple wafer handling areas 222A, 222B, 222C, 222D, in accordance with some embodiments. Each wafer handling area 222A, 222B, 222C, 222D may include a different configuration of wafer handling nodes. For example, wafer handling area 222A may include a wafer store 224A that is a processing tool, a mobile robotic arm 226A, and an autonomous cart 228A. Wafer handling area 222B may include a wafer store 224B1 that is a processing tool that is also interfaced with an overhead rail system 225 of an AMHS, a passive wafer store 224B2, a mobile robotic arm 226B, and multiple autonomous carts 228B1, 228B2. Wafer handling area 222C may include a wafer store 224C and a mobile robotic arm 226C. Lastly, wafer handling area 222D may include a wafers store 224D that is a wafer stocker also interfaced with the overhead rail system 225 of the AMHS. A mobile robotic arm 230 may be enroute to the wafer handling area 222B and not in wafer handling area 222B.

Wafer handling area 222B may include both a wafer store 224B1 that is a processing tool and a passive wafer store 224B2. The passive wafer store 224B2 may include wafers that are processed by the wafer store 224B1 that is a processing tool, but that are waiting to be further processed and/or transported by the automated wafer handling system 220. Accordingly, while waiting to be processed by the automated wafer handling system 220, they may be stored temporarily in the passive wafer store 223B1 that is a rack. Also, the wafer store 224B1 that is a processing tool may be interfaced with a rail based automated material handling system to receive wafers and/or wafer carriers via vehicles that are transported via the rail system 225.

As discussed above, the various wafer handling nodes of an automated wafer handling system 220 may be rearranged as desired within a FAB. For example, in an effort to expedite a bottleneck forming at the wafer handling area 222B, the mobile robotic arm 230 may be moved from wafer handing area 222D to wafer handling area 222B. This may be performed, for example, by the mobile robotic arm 226B communicating with the mobile robotic arm 230 to come to the mobile robotic arm's 226B assistance. Also, multiple autonomous carts 228B1, 228B2 may be at the wafer handing area 222B to expedite transfer from the wafer handling area 222B. For example, autonomous cart 228B2 may be transferred from service between wafer handling area 222C and 222D to service transportation between wafer handling areas 222A and 222B. This transfer may be facilitated by the automated cart 228B1 serving as transport between wafer handling areas 222A and 222B after no more wafer carriers are located at wafer store 224C.

Accordingly, as bottlenecks are identified, various wafer handling nodes may be repositioned as desired to reallocate wafer handling nodes and prioritize transfer and/or transportation of wafers between certain wafer handling areas. These bottlenecks may be formed by any of a variety of reasons, such as breakdown or damage of particular wafer handling nodes (e.g., breakdown or damage to mobile robotic arm 226B) and/or completion of semiconductor wafer processing for certain batches of wafers and/or wafer carriers.

Figure 2B:
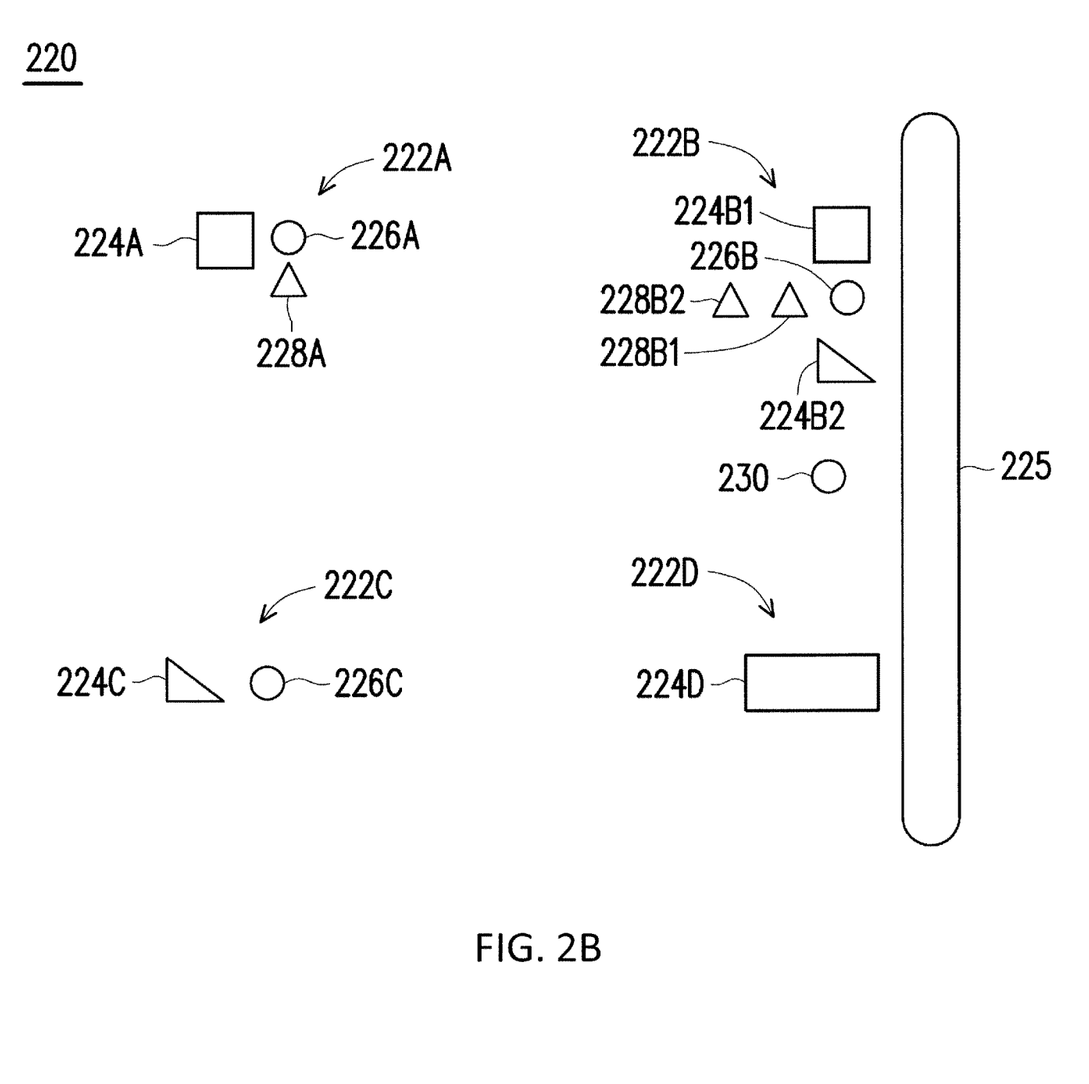
FIG. 2B is a conceptual plan view of the automated wafer handling system of FIG. 2A, in accordance with some embodiments.

FIG. 2B is a conceptual plan view of the automated wafer handling system 220 of FIG. 2A, in accordance with some embodiments. As noted above, wafer stores may include stockers, processing tools, and racks. Stockers are represented as rectangles, processing tools are represented as squares, racks are represented as right triangles, mobile robotic arms are represented as circles, and autonomous carts are represented by equilateral triangles.

Also, as noted above, the automated wafer handling system 220 may include different wafer handling areas 222A, 222B, 222C, 222D with a different configuration of wafer handling nodes. For example, wafer handling area 222A may include a wafer store 224A that is a processing tool, a mobile robotic arm 226A, and an autonomous cart 228A. Wafer handling area 222B may include a wafer store 224B1 that is a processing tool that is also interfaced with an overhead rail system 225 of an AMHS, a passive wafer store 224B2, a mobile robotic arm 226B, and multiple autonomous carts 228B1, 228B2. Wafer handling area 222C may include a wafer store 224C and a mobile robotic arm 226C. Lastly, wafer handling area 222D may include a wafers store 224D that is a wafer stocker also interfaced with the overhead rail system 225 of the AMHS. The mobile robotic arm 230 may be enroute to the wafer handling area 222B and not in wafer handling area 222B.

Figure 3:
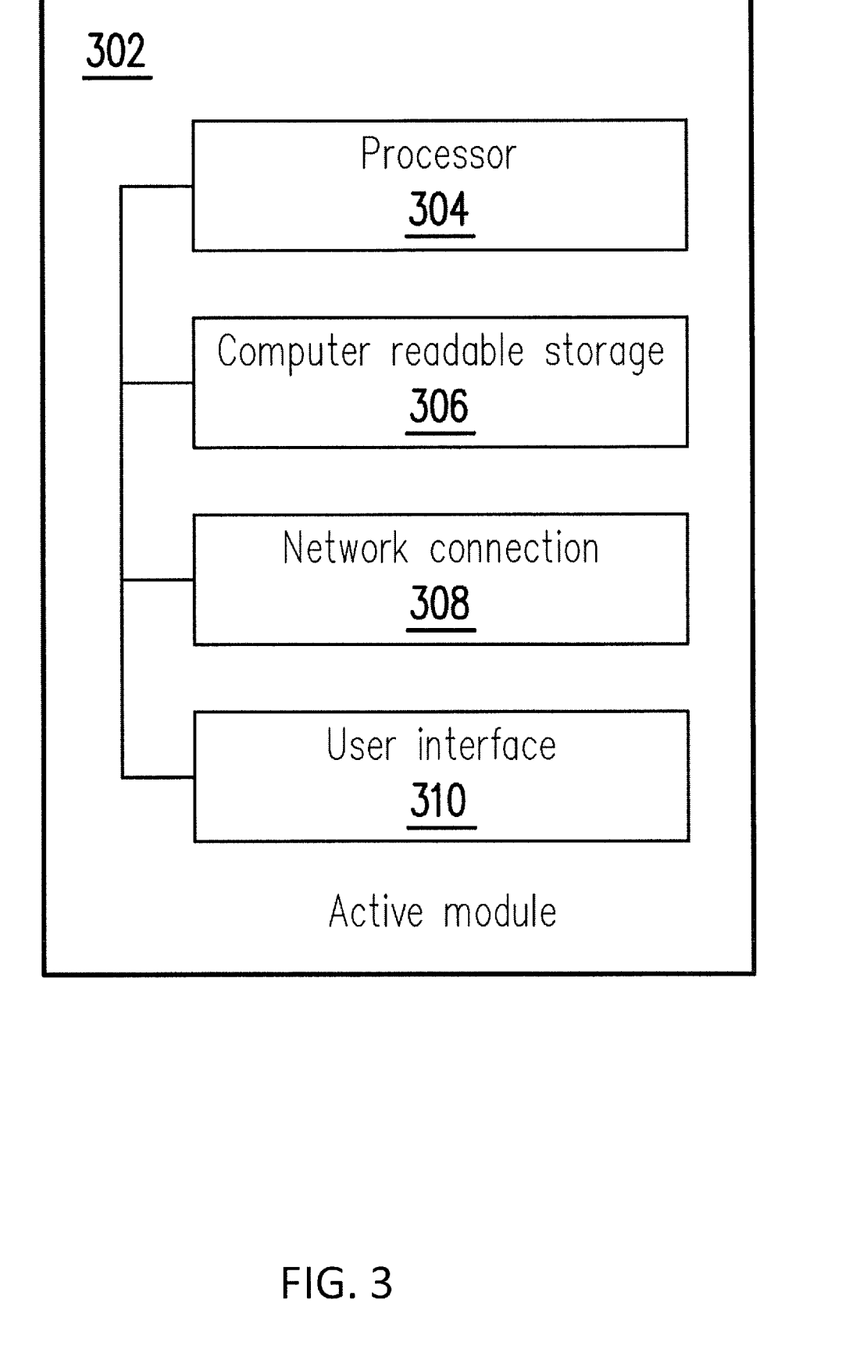
FIG. 3 is a block diagram of various functional modules of an automated wafer handling system, in accordance with some embodiment.

FIG. 3 a block diagram of an active module 302 of an automated wafer handing system, in accordance with some embodiment. As discussed above, active wafer handing nodes may have active modules 302 to actively facilitate communication and control among the wafer handling nodes. The active module 302 may include a processor 304. In further embodiments, the processor 304 may be implemented as one or more processors. The processor 304 may be operatively connected to a computer readable storage module 306 (e.g., a memory and/or data store), a network connection module 308, and user interface module 310.

The processor 304 may be configured to control various physical apparatuses to facilitate communication and control among the wafer handling nodes. For example, the processor 304 may be configured to control movement or functionality for at least one of a wheel, a robotic arm, the network connection module 308, the computer readable storage 306, the user interface module 310 or any other controllable aspect of an active wafer handling node that the active module is part of. For example, the processor 304 may control a motor that may move at least one of a wheel, a transceiver, and/or a robotic arm (e.g., for a mobile robotic arm).

In some embodiments, the computer readable storage module 306 may include automated wafer handling logic that may configure the processor 304 to perform the various processes discussed herein. The computer readable storage may also store wafer data, such as identification information for the wafer carrier and/or the wafers within a particular wafer carrier, further instructions for processing of wafers within a specific wafer carrier, notes on past processing performed upon wafers within a wafer carrier, a wafer carrier transportation history (e.g., where the wafer carrier has been transported), and any other parameter or information that may be utilized to perform the various processes discussed herein.

The network connection module 308 may facilitate a network connection of a wafer handling node with various devices and/or components internal to or external to the automated wafer handling system 300. In certain embodiments, the network connection module 308 may facilitate a physical connection, such as a line or a bus. In other embodiments, the network connection module 308 may facilitate a wireless connection, such as over a wireless local area network (WLAN) by using a transmitter, receiver, and/or transceiver. For example, the network connection module 308 may facilitate a wireless or wired connection with other wafer handling nodes.

The active module 302 may also include the user interface module 310. The user interface module 310 may include any type of interface for input and/or output to an operator of the automated wafer handing system, including, but not limited to, a monitor, a laptop computer, a tablet, or a mobile device, etc.

Figure 4:
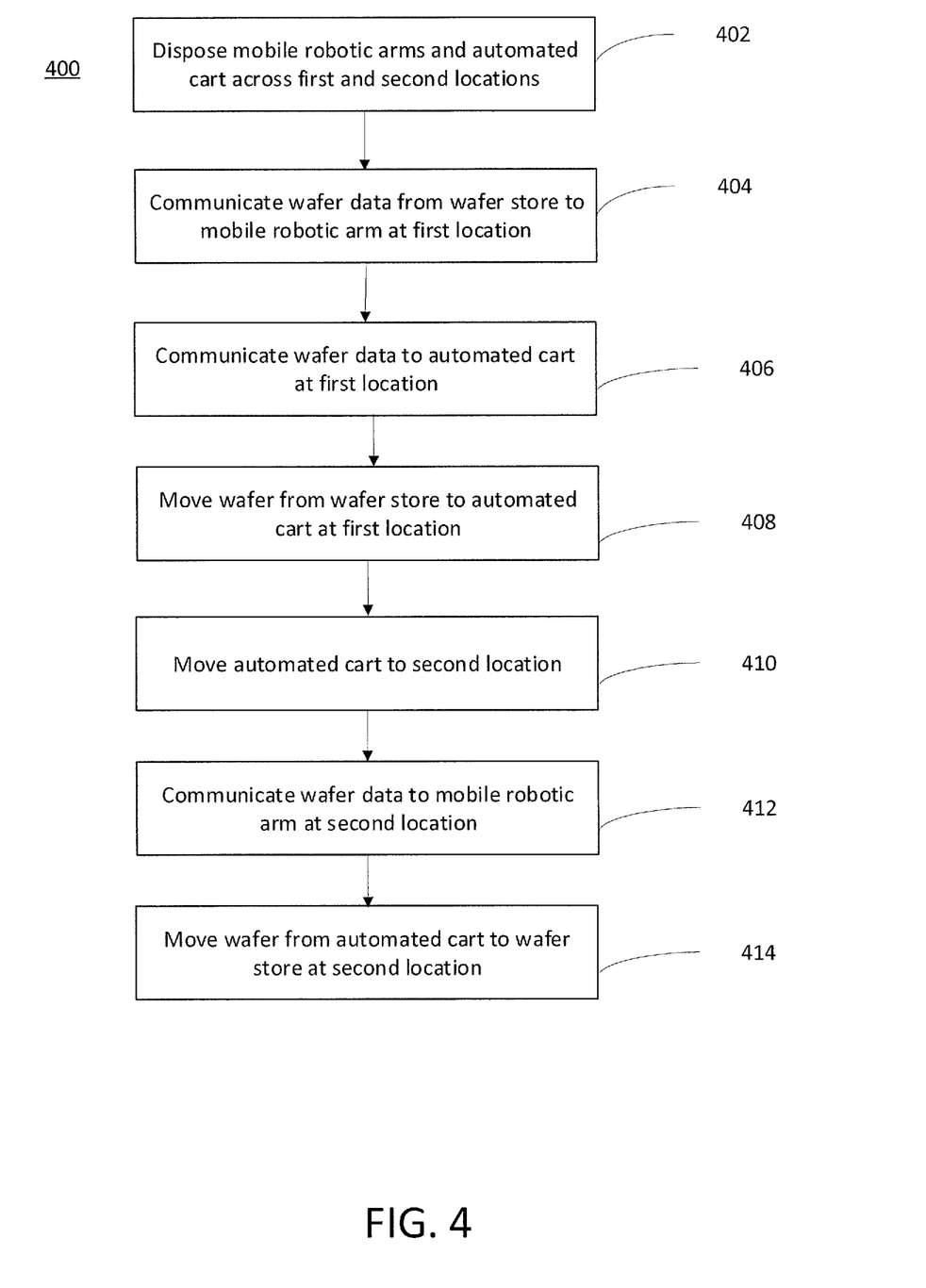
FIG. 4 is a flow chart of an automated wafer handling process, in accordance with some embodiments.

FIG. 4 is a flow chart of an automated wafer handling process, in accordance with some embodiments. The automated wafer handling process may be performed by at least one wafer handling node. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, various wafer handling nodes may be disposed about a FAB. For example, a FAB may have a first location (e.g., first wafer handling area) and a second location (e.g., second wafer handling area). Each location may include a wafer store (e.g., a processing tool, a wafer stocker, shelf, or a rack). A mobile robotic arm may be disposed at each of the first and second locations, adjacent to the wafer store at a distance sufficient for the robotic arm to manipulate or move a wafer and/or a wafer carrier from the wafer store to an adjacent autonomous cart. Also, an autonomous cart may be disposed next to the mobile robotic arm at the first location and be configured to transport wafers and/or wafer carriers between the first and second locations.

Each location may have known positions for each of the wafer handling nodes at each location so that the wafer handling nodes may know how they are disposed relative to other wafer handling nodes for interactions among the wafer handling nodes. For example, the mobile robotic arm may move to a designated position and orientation as marked via markers (e.g., an indicator readable by the mobile robotic arm) on the ground of a FAB and/or to position itself at a set place relative to a wafer store based on a marker on the wafer store. Similarly, an autonomous cart may move to a designated place and orientation at the first or second locations based on markers identifiable to the autonomous cart on the ground and/or on a mobile robotic aim. The relative positioning of various wafer handling nodes at each of the first and/or second locations and relative to each other may be performed in a conventional manner and will not be discussed in detail herein.

At operation 404, wafer data may be communicated from a wafer store to a mobile robotic arm at the first location. The wafer data may be actively communicated, for example via a wireless link, where both the wafer store and the mobile robotic arm are active wafer handling nodes with active modules (e.g., with a processor module and network connection module). Accordingly, such a wafer store and mobile robotic arm may facilitate conventional wireless communication links to transfer wafer data, such as by first establishing a communication link and then communicating information between the wafer store and the mobile robotic arm. In other embodiments, the wafer data may be passively communicated, such as by the robotic arm reading a passive data store at the wafer store, such as an RFID tag and/or a bar code at the wafer store for the wafer data. In certain embodiments, the mobile robotic arm may read wafer data from the wafer store and cross reference and/or annotate the wafer data with additional wafer data retrieved from a network connection with a centralized data store accessible to the mobile robotic arm. For example, the mobile robotic arm may read the wafer data from the wafer store that includes an identifier and then look up additional information based on the identifier from a centralized data store accessible to the mobile robotic arm over a network (e.g., the Internet) using the network connection module of the mobile robotic arm.

At operation 406, the wafer data may be communicated from the mobile robotic arm to the autonomous cart at the first location. The wafer data may be communicated between the mobile robotic arm and the autonomous cart at the first location using a network connection module of each wafer handling node. In certain embodiments, the communication of the wafer data may also function as a command to the autonomous cart for the autonomous cart to note that it is about to receive the wafer and/or wafer carrier associated with the wafer data and to transport the associated wafer and/or wafer carrier when possible (e.g., once the autonomous cart is full and ready for transport).

In particular embodiments, the communication of the wafer data may prompt the autonomous cart to accept or reject the associated wafer and/or wafer carrier. For example, the mobile robotic arm may communicate the wafer data to the autonomous cart. Then, the autonomous cart may decide whether it can take the wafer and/or wafer carrier associated with the wafer data and send an indicator to the mobile robotic arm concerning whether the autonomous cart may accept or reject the associated wafer.

At operation 408, the wafer and/or wafer carrier associated with the wafer data communicated in operation 406 may be transported from the wafer store to the autonomous cart by the mobile robotic arm. In certain embodiments, the mobile robotic arm may move wafers and/or wafer carriers from known locations at the wafer store, such as at an exit area of a load port of a processing tool where wafers and/or wafer carriers are disposed after processing by the processing tool. Another example of a known location may include a particular known location of a rack for a wafer and/or wafer carrier for transport by the automated wafer handling system. These locations for wafers and/or wafer carriers may be known and predetermined for the mobile robotic arm in a conventional manner. For example, the mobile robotic arm may utilize a sensor to scan whether any wafers and/or wafer carriers are located at a wafer store and, if any are detected, transport the detected wafers and/or wafer carriers. In embodiments where the autonomous cart may reject or accept the associated wafer and/or wafer carrier, operation 408 is performed for accepted wafers and/or wafer carriers (and not for non-accepted wafers and/or wafer carriers).

In further embodiments, operations 406 and 408 may be performed at a same time, and not one before the other, such as where wafer data is communicated as the associated wafer and/or wafer carrier is transported from the wafer store to the autonomous cart by the mobile robotic aim. Also, operation 406 may be performed after operation 408, such as where a wafer and/or wafer carrier is first transported and then the associated wafer data communicated to the autonomous cart.

At operation 410, the autonomous cart may transport the wafer and/or wafer carrier from the first location to the second location. The autonomous cart may transport the wafer along a path predetermined by the autonomous cart, or along a path determined autonomously on the fly by the autonomous cart. In certain embodiments, the autonomous cart may determine the second location that the autonomous cart is to transport the wafer to based on the wafer data, such as by transporting particular wafers (e.g., identified by the received wafer data) to particular second locations. These associations between particular wafer data and particular second locations may be determined by the autonomous cart by a look up table or other data structure that maps the wafer data to known second locations for particular wafer data. In other embodiments, the location may be sent to the autonomous cart by the mobile robotic arm (e.g., where the mobile robotic arm may have determined the location based on the wafer data). In various embodiments a path to a particular location may be predetermined prior to the autonomous cart setting out along the path and/or setting out from the first location to the second location or vice versa. Stated another way, the autonomous cart may be configured to travel along a predetermined path to avoid known stationary obstacles in traveling between the first location and the second location or vice versa. In certain embodiments, this predetermined path may be communicated to the autonomous cart (e.g., as communicated to the autonomous cart from the mobile robotic arm). In further embodiments, this predetermined path may be determined by a pathing module of the autonomous cart based on the first and second locations are as well as the topology of the FAB between the first and second location, as discussed above.

At operation 412, the autonomous cart may communicate the wafer data to a mobile robotic arm at the second location. The mobile robotic arm at the second location may be different than the mobile robotic arm at the first location. The wafer data may be communicated between the mobile robotic arm and the autonomous cart at the second location using a network connection module of each wafer handling node.

At operation 414, the wafer and/or wafer carrier associated with the wafer data communicated in operation 412 may be transported from the autonomous cart to the wafer store at the second location by the mobile robotic arm. In certain embodiments, the mobile robotic arm may move wafers and/or wafer carriers from set locations on an autonomous cart (e.g., within a bed or a payload deposit area of an autonomous cart) to set locations at the wafer store, such as at an exit area of a load port of a processing tool where wafers and/or wafer carriers are disposed after processing by the processing tool.

In certain embodiments, the wafer data may be communicated to the wafer store from the mobile robotic arm at the second location during, before, or after operation 414. For example, the wafer data may be communicated in conjunction with the transport of the wafer and/or wafer carrier via wireless or wired communications between the network connection modules of the mobile robotic aim and the wafer store. As another example, the wafer data may be part of a wafer carrier (e.g., as a RFID tag or a bar code on the wafer carrier) and thus communicated by transporting the wafer carrier to the wafer store.

Figure 5:
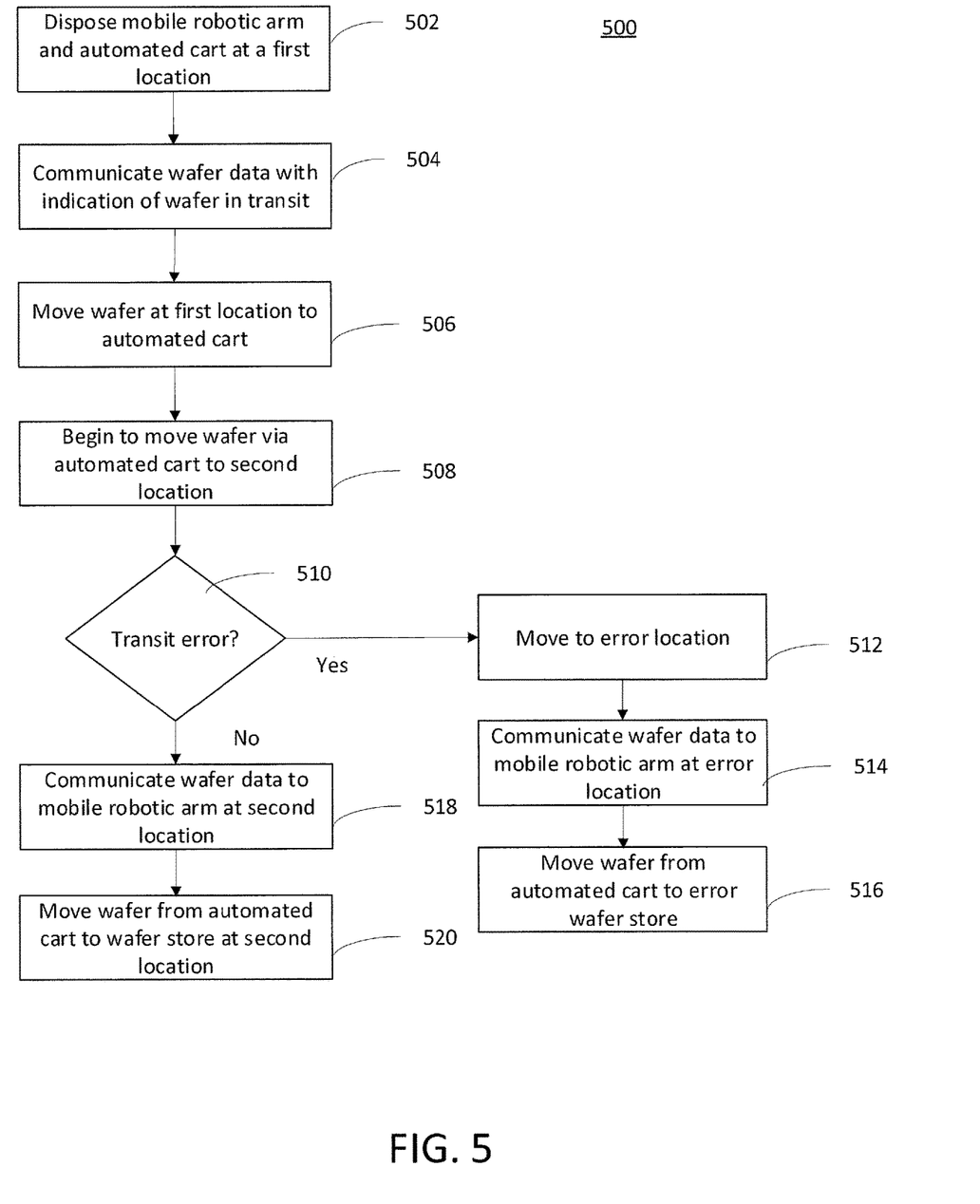
FIG. 5 is a flow chart of an automated wafer transition error handling process, in accordance with some embodiments.

FIG. 5 is a flow chart of an automated wafer transition error handling process, in accordance with some embodiments. The automated wafer transition error handling process may be performed by at least one wafer handling node. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, various wafer handling nodes may be disposed at a first location relative to a second location. For example, a FAB may have a first location (e.g., first wafer handling area) and a second location (e.g., second wafer handling area). A first mobile robotic arm may be disposed at the first location, adjacent to a first wafer store at a distance sufficient for the first robotic arm to manipulate or move a wafer and/or a wafer carrier from the first wafer store to an adjacent autonomous cart. Also, the adjacent autonomous cart may be disposed next to the first mobile robotic arm at the first location and be configured to transport wafers and/or wafer carriers between the first and second locations.

At operation 504, wafer data with an indication that associated wafers are in transit may be communicated from the first wafer store to the first mobile robotic arm and to the autonomous cart at the first location. The wafer data may be actively communicated, for example via a wireless link, where both the wafer store and the first mobile robotic arm are active wafer handling nodes with active modules (e.g., with a processor module and network connection module).

Accordingly, such a wafer store and first mobile robotic arm may facilitate wireless communication links to transfer wafer data indicating that associated wafers are in transit, such as by first establishing a communication link and then communicating information between the wafer store and the first mobile robotic arm. In other embodiments, the wafer data indicating that associated wafers are in transit may be passively communicated, such as by the first mobile robotic arm reading a passive data store at the wafer store, such as an RFID tag and/or a bar code at the wafer store for the wafer data so that the wafers in transit may be identified. In certain embodiments, the first mobile robotic a n may read wafer data from the wafer store and cross reference and/or annotate the wafer data with additional wafer data retrieved from a network connection with a centralized data store accessible to the first mobile robotic arm. For example, the first mobile robotic arm may read the wafer data from the wafer store that includes an identifier and then look up additional information based on the identifier from a centralized data store accessible to the first mobile robotic arm over a network (e.g., the Internet) using the network connection module of the first mobile robotic arm to determine and/or indicate that associated wafers are in transit.

In particular embodiments, the wafer data may be communicated from the first mobile robotic arm to the autonomous cart at the first location. The wafer data may be communicated between the first mobile robotic arm and the autonomous cart at the first location using a network connection module of each wafer handling node. In certain embodiments, the communication of the wafer data may also function as a command to the autonomous cart for the autonomous cart to note that it is about to receive the wafer and/or wafer carrier associated with the wafer data and to transport the associated wafer and/or wafer carrier when possible (e.g., once the autonomous cart is full and ready for transport).

At operation 506, the wafer and/or wafer carrier associated with the wafer data communicated in operation 504 may be transported from the wafer store to the autonomous cart by the first mobile robotic arm. In certain embodiments, the first mobile robotic arm may move wafers and/or wafer carriers from known locations at the first wafer store. These locations for wafers and/or wafer carriers may be known and predetermined for the first mobile robotic arm. For example, the first mobile robotic arm may utilize a sensor to scan whether any wafers and/or wafer carriers are located at the first wafer store and, if any are detected, transport the detected wafers and/or wafer carriers.

At operation 508, the autonomous cart may begin to transport the wafer and/or wafer carrier from the first location to the second location. The autonomous cart may transport the wafer along a path predetermined by the autonomous cart, or along a path determined autonomously on the fly by the autonomous cart. In certain embodiments, the autonomous cart may determine the second location that the autonomous cart is to transport the wafer to based on the wafer data, such as by transporting particular wafers (e.g., identified by the received wafer data) to particular second locations. These associations between particular wafer data and particular second locations may be determined by the autonomous cart by a look up table or other data structure that maps the wafer data to known second locations for particular wafer data. In other embodiments, the location may be sent to the autonomous cart by the first mobile robotic arm (e.g., where the first mobile robotic arm may have determined the location based on the wafer data). In various embodiments a path to a particular location may be predetermined prior to the autonomous cart setting out along the path and/or setting out from the first location to the second location or vice versa. Stated another way, the autonomous cart may be configured to travel along a predetermined path to avoid known stationary obstacles in traveling between the first location and the second location or vice versa. In certain embodiments, this predetermined path may be communicated to the autonomous cart (e.g., as communicated to the autonomous cart from the first mobile robotic arm). In further embodiments, this predetermined path may be determined by a pathing module of the autonomous cart based on the first and second locations are as well as the topology of the FAB between the first and second location, as discussed above.

At operation 510, a determination may be made as to whether there is a transit error during transit from the first location to the second location. This transit error may be any erroneous state determined during the transit of the wafer and/or wafer carrier by the autonomous cart from the first location to the second location. For example, the erroneous state that triggers the transit error may occur when vibrations detected at the autonomous cart exceeds a vibrational threshold or when the time in transit exceeds a queue time threshold. The vibrational threshold may be a threshold beyond which vibrations are indicative of a possible harmful environment for the wafers and/or wafer carriers under transport, such as during an earthquake. The queue time threshold may be a time threshold that indicates that more than a nominal time allocated to the operation of transport from the first location to the second location has elapsed.

If the transit error has occurred (e.g., either the vibrational threshold or the queue time threshold has been exceeded) during transit from the first location to the second location, then the process 500 may proceed to operation 512. If the transit error has not has not occurred during transit from the first location to the second location, then the process 500 may proceed to operation 518.

At operation 512, the autonomous cart may move to an error location. This error location may be proximate to, or include, an error wafer store set aside to receive wafers and/or wafer carriers. The wafers and/or wafer carriers at the error location may be further inspected for defects, such as if the wafer carrier is too heavy, too light, or has some other error. Also, the autonomous cart at the error location may also be inspected for defects (e.g., if a part such as a wheel or other actuator of the autonomous cart is broken).

At operation 514, the autonomous cart may communicate the wafer data to a remediation mobile robotic arm at the error location. The remediation mobile robotic arm at the error location may be different than the first mobile robotic arm at the first location. The wafer data may be communicated between the remediation mobile robotic arm and the autonomous cart at the error location using a network connection module of each wafer handling node.

At operation 516, the wafer and/or wafer carrier associated with the wafer data communicated in operation 514 may be transported from the autonomous cart to the error wafer store by the remediation mobile robotic arm at the error location. In certain embodiments, the remediation mobile robotic arm may move wafers and/or wafer carriers from set locations on the autonomous cart (e.g., within a bed or a payload deposit area of an autonomous cart) to set locations at the error wafer store.

In certain embodiments, the wafer data may be communicated to the error wafer store from the remediation mobile robotic arm at the error location. For example, the wafer data may be communicated in conjunction with the transport of the wafer and/or wafer carrier via wireless or wired communications between the network connection modules of the remediation mobile robotic arm and the error wafer store. As another example, the wafer data may be part of a wafer carrier (e.g., as a RFID tag or a bar code on the wafer carrier) and thus communicated by transporting the wafer carrier to the error wafer store. This wafer data may also indicate the transfer of the wafer carrier from the autonomous cart to the error wafer store At operation 518, the autonomous cart may communicate the wafer data to a second mobile robotic arm at the second location. The second mobile robotic arm at the second location may be different than the first mobile robotic arm at the first location and/or the remediation mobile robotic arm at the error location. The wafer data may be communicated between the second mobile robotic arm and the autonomous cart at the second location using a network connection module of each wafer handling node.

At operation 520, the wafer and/or wafer carrier associated with the wafer data communicated in operation 518 may be transported from the autonomous cart to a second wafer store at the second location by the second mobile robotic arm. In certain embodiments, the second mobile robotic arm may move wafers and/or wafer carriers from set locations on the autonomous cart (e.g., within a bed or a payload deposit area of an autonomous cart) to set locations at the second wafer store.

In certain embodiments, the wafer data may be communicated to the second wafer store from the second mobile robotic arm at the second location. For example, the wafer data may be communicated in conjunction with the transport of the wafer and/or wafer carrier via wireless or wired communications between the network connection modules of the second mobile robotic arm and the second wafer store. As another example, the wafer data may be part of a wafer carrier (e.g., as a RFID tag or a bar code on the wafer carrier) and thus communicated by transporting the wafer carrier to the second wafer store. This wafer data may also indicate the transfer of the wafer carrier from the autonomous cart at the second location.

In an embodiment a system includes: a wafer store comprising a wafer configured for processing by a semiconductor processing tool; a cart configured to transport the wafer from the wafer store along a predetermined path; a robotic arm, the robotic arm configured to: read wafer data from the wafer store, transport the wafer from the wafer store to the cart, send the wafer data to the cart, wherein the cart is configured to transport the wafer to a location in response to the wafer data.

In another embodiment, a system includes: a wafer store comprising a wafer configured for processing by a semiconductor processing tool; a robotic arm configured to: read wafer data from the wafer store, transport the wafer from the wafer store to a cart, the cart configured to: receive the wafer data from the robotic arm, transport the wafer to a location along a predetermined path in response to the wafer data, and communicate the wafer data to another robotic arm at the location.

In another embodiment, a method includes: receiving wafer data from a wafer store that comprises a wafer carrier comprising a wafer, wherein the wafer data characterizes the wafer; transporting the wafer carrier from the wafer store to a cart; and communicating the wafer data to the cart, wherein the cart is configured to transport the wafer carrier to a location by traveling along a predetermined path in response to receiving the wafer data.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
    a wafer store comprising a wafer configured for processing by a semiconductor processing tool;
    a cart configured to transport the wafer from the wafer store along a predetermined path;
    a robotic arm, the robotic arm configured to:
        read wafer data from the wafer store,
        transport the wafer from the wafer store to the cart,
        send the wafer data to the cart, wherein the cart is configured to transport the wafer to a location in response to the wafer data.

2. The system of claim 1, wherein the robotic arm is configured to:
    determine the location based on the wafer data, and
    communicate the location to the cart.

3. The system of claim 1, wherein the cart is configured to determine the location based on the wafer data.

4. The system of claim 1, wherein the robotic arm is configured to move to the location.

5. The system of claim 1, wherein the wafer store is configured to receive the wafer from an overhead cart suspended from a rail.

6. The system of claim 1, wherein the wafer store is one of: a wafer stocker and a rack.

7. The system of claim 1, wherein the location comprises: another robotic arm and another wafer store.

8. The system of claim 7, wherein the another robotic arm is configured to:
    transport the wafer from the cart to another wafer store at the location,
    receive the wafer data from the cart, and
    communicate the wafer data to the another wafer store.

9. A system, comprising:
    a wafer store comprising a wafer configured for processing by a semiconductor processing tool;
    a robotic arm configured to:
        read wafer data from the wafer store,
        transport the wafer from the wafer store to a cart,
    the cart configured to:
        receive the wafer data from the robotic arm,
        transport the wafer to a location along a predetermined path in response to the wafer data, and
        communicate the wafer data to another robotic arm at the location.

10. The system of claim 9, wherein the location comprises another wafer store.

11. The system of claim 9, wherein the predetermined path is communicated to the cart.

12. The system of claim 9, wherein the cart comprises a sensor configured to produce sensor data, wherein the cart is further configured to move to an error location in response to the sensor data exceeding a threshold value.

13. The system of claim 12, wherein the sensor is a timer, wherein the sensor data is a time, and wherein the cart is further configured to move to the error location in response to the time exceeding a queue threshold value.

14. The system of claim 12, wherein:
    the sensor is a vibrational sensor,
    the sensor data is at least one of a velocity, acceleration, and displacement, and
    the cart is further configured to move to the error location in response to the sensor data exceeding a vibrational threshold value.

15. A method, comprising:
    reading, by a robotic arm, wafer data from a wafer store that comprises a wafer carrier comprising a first wafer, wherein the wafer data characterizes the first wafer;
    transporting, by the robotic arm, the wafer carrier from the wafer store to a cart; and
    communicating, by the robotic arm, the wafer data to the cart, wherein the cart is configured to transport the wafer carrier to an location by traveling along a predetermined path in response to receiving the wafer data.

16. The method of claim 15, further comprising:
    reading the wafer data from the wafer carrier while the wafer carrier is part of the wafer store.

17. The method of claim 15, further comprising:
    receiving wafer data associated with a second wafer that is different than the first wafer, wherein the second wafer remains at the wafer store while the first wafer is transported to the location by the cart.

18. The method of claim 15, further comprising:
    determining the location based on the wafer data.

19. The method of claim 15, further comprising:
    receiving a notification of cart availability from the cart.

20. The method of claim 15, further comprising:
    receiving the wafer data from the wafer store via a transceiver on the robotic arm.

* * * * *